United States Patent [19]

Lindmayer

[11] 4,139,399

[45] Feb. 13, 1979

[54] SOLAR PANEL WITH REMOVABLE CELL MATRIX, AND METHOD OF MAKING SAME

[75] Inventor: Joseph Lindmayer, Bethesda, Md.

[73] Assignee: Solarex Corporation, Rockville, Md.

[21] Appl. No.: 870,506

[22] Filed: Jan. 18, 1978

[51] Int. Cl.² ............................................ H01L 31/04
[52] U.S. Cl. .................................... 136/89 H; 29/572
[58] Field of Search ........................ 136/89 H; 29/572

[56] References Cited

U.S. PATENT DOCUMENTS

| 3,376,164 | 4/1968 | Bachwansky | 136/89 |
| 3,427,459 | 2/1969 | Truffert | 250/209 |
| 3,982,963 | 9/1976 | Mahoney et al. | 136/89 |
| 4,057,439 | 11/1977 | Lindmayer | 136/89 P |

OTHER PUBLICATIONS

D. C. Carmichael et al., "Materials For Encapsulation Systems for Terrestrial Photovoltaic Arrays", *Conf. Record*, 12th IEEE Photovoltaic Specialists Conference, Nov. 1976, pp. 317–331.

*Primary Examiner*—John H. Mack
*Assistant Examiner*—Aaron Weisstuch
*Attorney, Agent, or Firm*—Watson, Cole, Grindle & Watson

[57] ABSTRACT

A solar panel is formed with a frame defining channels adapted to receive and retain a solid body of resin therein. The body of resin forms a matrix that encapsulates photovoltaic cells. Part of the frame may be disassembled to permit the matrix to be inserted into or removed from the channels.

7 Claims, 1 Drawing Figure

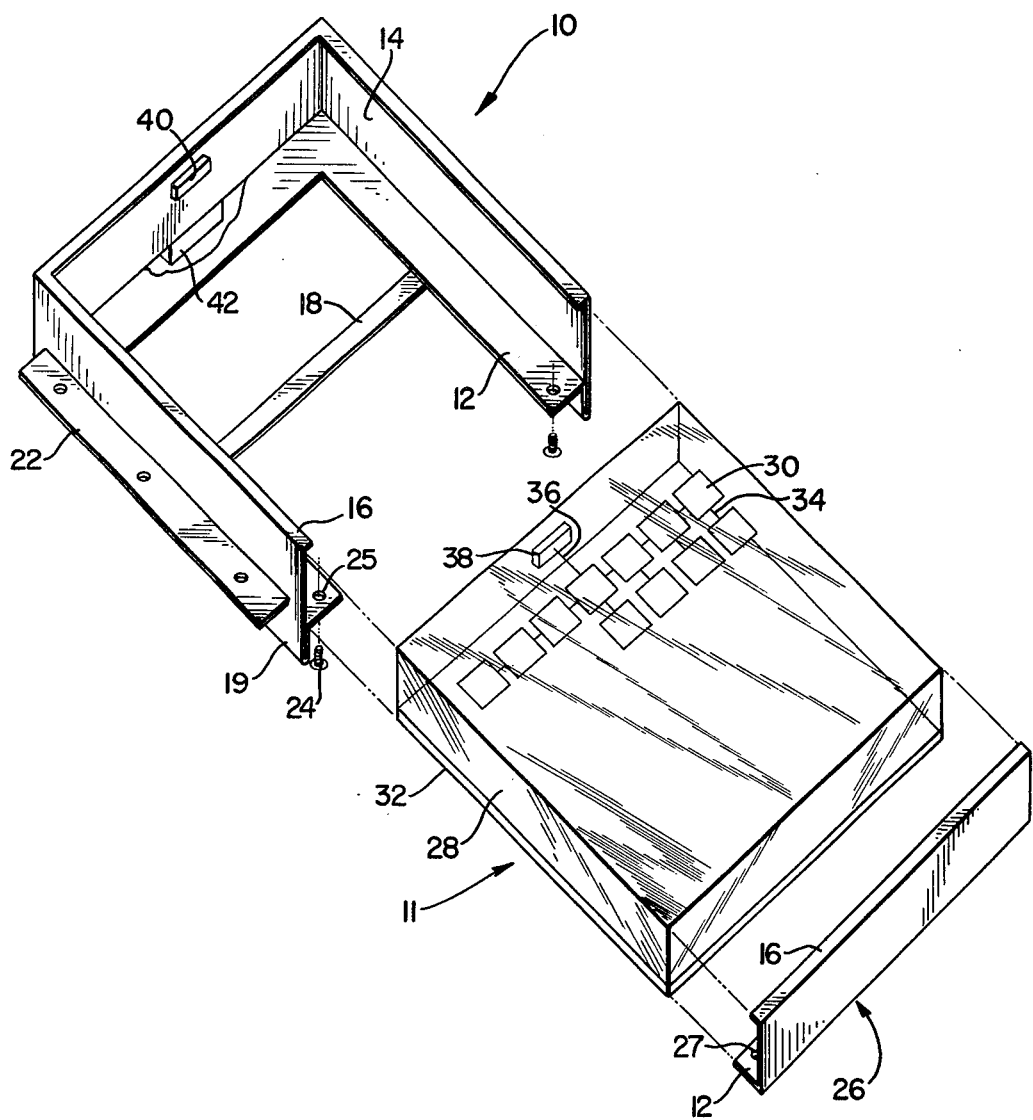

SOLAR PANEL WITH REMOVABLE CELL MATRIX, AND METHOD OF MAKING SAME

SUMMARY OF THE INVENTION

Briefly, the solar panel of my invention in its broadest aspect comprises a frame and a matrix in the form of a solid body of hardened resin encapsulating the photovoltaic cells and maintaining them in spaced, light-receiving position. The frame has a surface contoured to receive the resin body therein, and includes retaining means movable between a open position in which the matrix can be received or released from said contoured surface and a closed position in which the matrix is firmly held at the contoured surface. More specifically, the solar panel of this invention has a frame that forms an inwardly facing channel defined by front and back flanges of said frame, said channel being proportioned to releasably retain the matrix therein. The matrix includes an electrical contact affixed thereto in electrical connection with the cells disposed within the matrix, and the frame includes an electrical contact for directing electricity away from the frame. The matrix contact and the frame contact are electrically connected when the matrix is in retained position in the frame, and disconnected when the matrix has been removed from the frame. Further, a junction box is preferably mounted on the frame to receive electricity from the frame contact.

With respect to the method of manufacturing the solar panel, photovoltaic cells are disposed in a fluid body of resin, which is then hardened to form a solid matrix of predetermined shape having disposed therewithin a plurality of cells secured in spaced, light-receiving position. The matrix is then inserted in a frame having a surface contoured to receive and retain said matrix.

BACKGROUND OF THE INVENTION

The present invention relates generally to enclosures, such as trays and frames, for holding photovoltaic cells in position so that incident light may impinge upon the surface of the cells and be absorbed, thereby generating electrons that are directed away from the cells and stored, or utilized immediately. More particularly, the present invention is directed to solar panels and a method for manufacturing them, to eliminate problems inherent in in situ molding of the encapsulant body in the structural member that forms or cooperates to form the frame member of the solar panel in use.

In the prior art methods for the manufacture of solar panels, the body of encapsulant containing a plurality of solar cells is formed by providing a frame member and a continuous base member that cooperates with the frame to form a receptacle for forming and curing the encapsulating medium within which the solar cells are disposed. In the prior art methods, the base member, which may for example be a polyester board, is placed in a frame assembly having upwardly directed edges to form a receptacle for the encapsulant medium and solar cells. If polyester board, fiberglass or glass is used as a base member, a primer may be coated over the base member to facilitate adhesive binding of the encapsulating medium to the base member. A layer of the encapsulating medium, which may be a silicone rubber, is poured into the defined receptacle forming an encapsulant layer. One or more solar cells are then placed upon the layer of encapsulating medium and more encapsulating medium is then poured into the defined receptacle so that such medium completely encapsulates the solar framework lattice of solar panels without physically removing the entire solar panel. Additionally, since the encapsulant is adhesively bound to the frame member any flexure of the frame can cause delamination of the encapsulant which can propagate into the encapsulant body and result in exposure of the solar cells.

It is an object of the present invention to provide a solar panel and a method for the manufacture of same that eliminate detrimental effects such as delamination, caused by the occurrence of chemical reactions between the panel frame and the medium encapsulating the solar cell array, which reactions occur during in situ molding and curing of the encapsulant in the frame.

Another object is to provide a solar panel and method of manufacturing same wherein the body of encapsulating medium has an electrical contact integrally connecting the solar cells dispersed in the encapsulating body such that when the encapsulating body or matrix is inserted into a frame member, the contacts interface with electrical contacts affixed to the frame member to form a direct electrical connection between the solar cells and a junction box provided on the solar panel frame.

A further object is to provide a solar panel unit comprising a frame member and a replaceable body of encapsulated solar cells. The body of encapsulated solar cells may be inserted into an assembled latticework of panel frames to form a solar panel array. Additionally, damaged or inoperative solar panels can be repaired by removal of the inoperative or damaged matrix of encapsulated solar cells and replaced by an operative matrix of cells.

These and further objects, advantages, and features of the invention will be apparent in the arrangement and construction of the constituent parts of the panel as set forth in detail in the following description, taken together with the accompanying drawing, in which the sole FIGURE is an exploded, perspective view of a preferred embodiment of my invention.

DETAILED DESCRIPTION OF A PREFERRED EMBODIMENT

Referring to the drawing, a frame member indicated generally by reference numeral 10, has a support surface 12 that is capable of supporting a matrix indicated generally by reference numeral 11. The support surface 12 can be formed by an inwardly directed flange extending from the bottom of side wall 14, or may be a continuous surface integrally affixed to the side wall 14 of the frame 10. Another inwardly facing flange 16 is affixed to the upper edge of the side wall 14. The flange 16 cooperates with side wall 14 and support surface 12 to define an inwardly facing, contoured channel.

The structural integrity of the frame 10 may be increased by one or more reinforcement members 18. The reinforcement members 18 may be directly attached to the support surface 12 or may be affixed to a reinforcement flange 19. Interconnection flange members 22 may be attached to the outer wall surfaces of one or more side walls 14 to allow interconnection of the assembled solar panel units.

Attachment means such as a sheet metal screw 24 and cooperating hole 25 as shown, are provided on the support surface 12 or may be affixed to a reinforcement flange 19. Interconnection flange members 22 may be attached to the outer wall surfaces of one or more side walls 14 to allow interconnection of the assembled solar panel units.

Attachment means such as a sheet metal screw 24 and cooperating hole 25 as shown, are provided on the support surface 12 of the frame member to allow releasable attachment of side panel member 26, which has cooperating attachment means 27 to allow releasable attachment to the frame 10.

The body of cured encapsulant resin 28 must be capable of allowing transmission of light impinging on the surface of the encapsulant to the solar cells 30 disposed within the resin. Stabilized silicon rubber may be used as the encapsulating medium. A removable base support plate 32 may be used to provide additional support for the bottom surface of the body of resin 28. The support plate 32 may be reflective, or may be painted or may carry a design on its inner surface to improve the esthetic appearance of the solar panel in service.

The solar cells 30 are electrically interconnected by electrically conductive strips 34 and 36 to a recessed electrical contact 38 in the body of cured resin 28. Upon insertion of the encapsulant body 28 into the frame member 10, matrix contact 38 will interface with cooperating frame contact 40 to form an electrical connection. Frame contact 40 is electrically connected to a junction box 42 revealed by the broken away portion of flange 12. Therefore, upon insertion of the body of cured resin 28 into frame member 10, an electrical connection is effected between the solar cells 30 and the junction box 42 without the necessity of a separate wiring operation.

With respect to the process for making the solar panel of the present invention, prior art methods of encapsulating solar cells in a cell matrix may be utilized. The distinction from such methods is that after the cells are encapsulated in the cell matrix, they are then inserted releasably into a frame having a surface contoured to retain and receive the cell matrix therein. By way of specific example, I wish to incorporate my prior applications Ser. No. 715,417, filed Aug. 25, 1976, now U.S. Pat. No. 4,057,439 and Ser. No. 806,868, filed June 15, 1977, now U.S. Pat. No. 4,093,473, by reference herein, where those applications are of assistance in fully describing a method by means of which the cell matrix can be formed. The distinction between the disclosures of these applications, however, and that of the present invention is that the resin in which the photovoltaic cells are encapsulated in the instant application is not hardened within the bounds of a tray that, together with the cells and cured resin, will form the ultimate solar panel. Instead, in the present invention a silicone resin, e.g., a multi-part silicone resin such as Sylgard 182 sold by Dow-Corning Corporation, is hardened either in a separate mold from which quick release of the resin may be obtained, or without any mold whatsoever, the viscous consistency of the resin being relied on for defining the parameters of the body of resin. In this manner a resin body which, with the cells encapsulated therein, has been referred to as a cell matrix, is formed and can be freely inserted or released from a cooperating frame.

While this method might appear to be a simple expedient, it has significant advantages, when compared to prior art methods of in situ molding within a tray that is to form part of the finished solar panel. Among such advantages are the fact that when the resin, e.g., a silicone resin, is hardened or cured within the frame that forms part of the solar panel, that frame becomes part of the polymerization chemistry of the encapsulating medium at the interface between the frame and the resin. Chemical reaction can occur at the interface and cause physical discontinuities, such as bubbles, and these bubbles can enlarge into the encapsulant body and expose the solar cells to air. In fact, some otherwise acceptable frame materials can act as inhibitors to curds of the resin, which will remain in an unacceptable gel or semi-solid state.

Moreover, prior art in situ molding within the solar panel frame greatly limits the selection of frame material to those stable to high temperatures. Thus, curing temperatures from silicone resins may be in a range of about 180° C., and the frame materials must be selected from those that can withstand such temperatures. By forming the encapsulant resin separately from the frame, lighter weight, non-metallic materials can be used for the frame. Their prime limitations will be structural integrity and resistance to environmental degradation, rather than resistance to heat.

Consequently, there are real advantages in forming the cell matrix separately from the frame of the solar panel, and such matrix may be formed in the same way as that described in said prior applications except that, in lieu of pouring the encapsulant directly into the tray, the periphery of which is to form the solar panel, a mold is used from which the cell matrix may be released or cut, or, more preferably, the resin is maintained in its desired shape without any mold or frame member whatsoever, utilizing the consistency of the silicone resin, itself. At the present time it has been found preferable to use as a base on which the silicon resin is spread, a mat base member in accordance with U.S. application Ser. No. 814,923, filed July 12, 1977, in the name of Ramon Dominguez. That application is directed to the advantages of using a glass mat polyester laminate as the base member, and gives as its preferred example the utilization of such a mat sold by Glastic Corporation of Cleveland, Ohio under the trademark, Glastic 200, which mat has a preferred thickness of 3/32 inch. Glass may also be used as the base member, and the matrix then inverted so that the glass will cover and protect the resin and cells.

Returning now to the sole figure of the drawing, after a cell matrix 11 has been formed, it is located so that it will fit within and be guided by support surface 12, side wall 14 and upper flange 16 of the frame member 10. After insertion, as so guided, an electrical connection will have been effected between the cell matrix contact 38 and the cooperating frame contact 40 to form an electrical connection from the solar cells 30 to the junction box 42 without the necessity of any separate wiring operation.

While the present invention has been illustrated and described with respect to the specific embodiment thereof, certain modifications and alterations thereof will be apparent to those of skill in this art. As to all such modifications and alterations, I desire that they be included within the scope of my invention, which is to be limited only by the purview of the following, appended claims.

I claim:

1. A solar panel for maintaining photovoltaic cells in position to receive and absorb light impinging thereon, comprising a frame and a matrix in the form of a solid body of hardened resin encapsulating said cells and maintaining them in spaced, light-receiving position, said frame having a surface contoured to receive said resin body therein, said frame including retaining means movable between an open position in which said matrix can be received or released from said contoured surface and a closed position in which said matrix is firmly held at said contoured surface.

2. A solar panel as claimed in claim 1, in which said contoured surface is an inwardly facing channel defined by top and bottom flanges of said frame, said channel being proportioned to releasably retain said matrix therein.

3. A solar panel as claimed in claim 1, in which said matrix includes an electrical contact affixed thereto in electrical connection with said cells disposed therewithin, and said frame includes an electrical contact for directing electricity away from said frame, said matrix contact and said frame cntact being electrically connected when said matrix is in retained position in said frame, and disconnected when said matrix is removed therefrom.

4. A solar panel as claimed in claim 3, in which a junction box is mounted in said frame to receive electricity from said frame contact. solid 5. A method of manufacturing a solar panel, comprising disposing photovoltaic cells in a fluid body of resin capable of hardening and encapsulating the cells, hardening said resin to form a said matrix of predetermined shape having disposed therewithin a plurality of cells secured in spaced, light-receiving position, and inserting said matrix in a frame having a surface contoured to receive and retain said matrix thereat.

6. A method as claimed in claim 5, in which said resin is a silicone resin.

7. A solar panel for maintaining photovoltaic cells in position to receive and absorb light impinging thereon, comprising a frame and a matrix in the form of a solid body of hardened resin encapsulating said cells and maintaining them in spaced, light-receiving position, said frame including side walls with top and bottom inwardly extending flanges to define an inwardly facing channel to receive said resin body therein, said frame also including retaining means movable between an open position in which said matrix can be received or removed from said channel and a closed position in which said matrix is firmly held in said channel.

* * * * *